United States Patent
Kim (10) Patent No.: US 8,592,913 B2
(45) Date of Patent: Nov. 26, 2013

(54) SEMICONDUCTOR DEVICE FOR PREVENTING PLASMA INDUCED DAMAGE AND LAYOUT THEREOF

(75) Inventor: Jong-Su Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 229 days.

(21) Appl. No.: 13/101,617

(22) Filed: May 5, 2011

(65) Prior Publication Data

US 2012/0168870 A1    Jul. 5, 2012

(30) Foreign Application Priority Data

Dec. 29, 2010    (KR) .................. 10-2010-0137760

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC .................. 257/368; 257/288; 257/E27.016

(58) Field of Classification Search
USPC ....................................... 257/368
See application file for complete search history.

(56) References Cited

U.S. PATENT DOCUMENTS

| | | |
|---|---|---|
| 6,417,544 B1 | 7/2002 | Jun et al. |
| 6,946,708 B2 * | 9/2005 | Okazaki ................. 257/355 |
| 2009/0146192 A1 | 6/2009 | Brisbin et al. |

FOREIGN PATENT DOCUMENTS

| | | |
|---|---|---|
| JP | 2007-242899 | 9/2007 |
| KR | 1019990031689 | 5/1999 |

OTHER PUBLICATIONS

Notice of Allowance issued by the Korean Intellectual Property Office on May 31, 2012.

* cited by examiner

*Primary Examiner* — Thien F Tran
(74) *Attorney, Agent, or Firm* — IP & T Group LLP (57) ABSTRACT

A semiconductor device includes a diode having a first terminal connected to a first-conductivity-type well, and a second-conductivity-type MOS transistor having a first junction and a gate connected to a second terminal of the diode, and a second junction connected to a first power supply voltage terminal.

12 Claims, 7 Drawing Sheets

SEMICONDUCTOR DEVICE FOR PREVENTING PLASMA INDUCED DAMAGE AND LAYOUT THEREOF

CROSS-REFERENCE TO RELATED APPLICATIONS

The present application claims priority of Korean Patent Application No. 10-2010-0137760, filed on Dec. 29, 2010, which is incorporated herein by reference in its entirety.

BACKGROUND

1. Field of the Invention

Exemplary embodiments of the present invention relate to a semiconductor device, and more particularly, to a semiconductor device for preventing plasma induced damage (PID), and a layout thereof.

2. Description of the Related Art

As the integration density of semiconductor devices increases, a pitch between patterns formed on a wafer surface is continuously reduced and an aspect ratio is gradually increased. Thus, concerns that have not previously arisen during the fabrication of semiconductor devices or have been previously unimportant are surfacing.

Among them, PID occurring during a process using plasma, for example, a deposition or etch process using plasma, degrades characteristics of a device.

PID refers to damage that is generated in a process using plasma, while electric charges trapped into a wafer are being discharged by plasma ions.

Such PID is influenced by many causes, such as ions formed by plasma and extreme ultraviolet radiation. In particular, it has been known that the charging of a wafer by ions is the major cause of PID.

Figure 1:
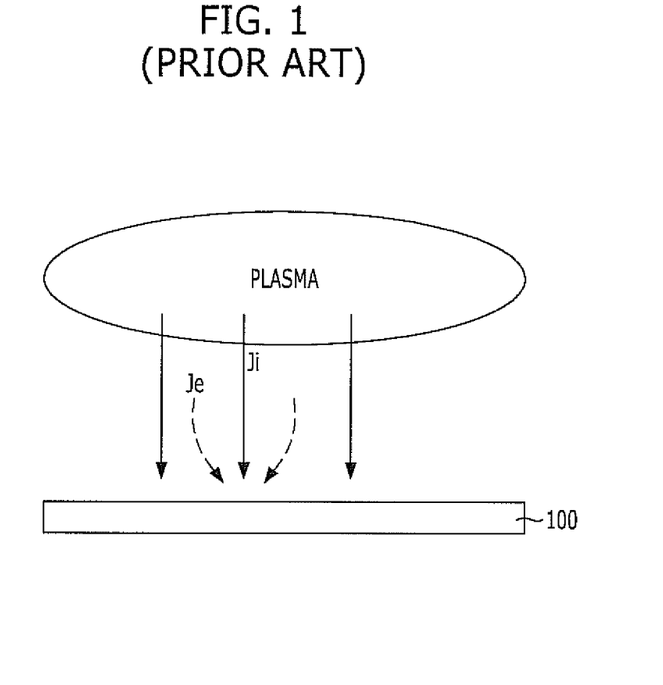
FIGS. 1 and 2 are diagrams illustrating PID that is generated in the prior art.
Figure 2:
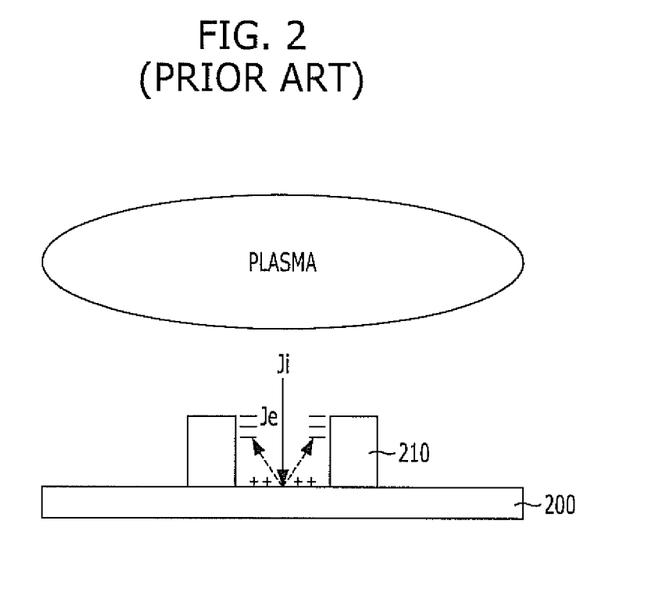

FIGS. 1 and 2 are diagrams illustrating PID that is generated in the prior art.

Referring to FIG. 1, in the deposition and etch processes using plasma, excited molecules, radicals, and fractions of ions Ji and electrons Je exist within plasma generated by the supply of source gas. These electrons Je and ions Ji are incident on a wafer 100 with constant energy. At this time, an amount of electrons Je and an amount of ions Ji, which are incident on the wafer 100, are equal to each other. However, due to a difference of velocity distribution, almost all the ions Ji are incident vertically on the surface of the wafer 100, while the electrons Je are incident at a predetermined angle with respect to the surface of the wafer 100. Accordingly, the charging of the ions Ji and the electrons Je may be evenly distributed in a case in which a structure, such as patterns, does not exist on the wafer 100, but the charging of the ions Ji and the electrons Je may be unevenly distributed in a case in which patterns do exist on the wafer 100.

More specifically, as illustrated in FIG. 2, in a case in which a structure, such as patterns 210, exists on a wafer 200, since most of the ions Ji are incident vertically on the surface of the wafer 200, an amount of ions Ji incident on the surface of the wafer 200 is not greatly changed. However, in the case of electrons Je, the incident path of the electrons Je is blocked by the patterns 210. Thus, the electrons Je may not reach the wafer 200 between the patterns 210, because they bounce off the patterns 210. Accordingly, the number of the electrons Je which are incident on the wafer 200 between the patterns 210 may be reduced. Instead, the electrons Je incident on the walls of the patterns 210 may be increased as compared to the ions Ji, and the upper sides of the patterns 210 may be charged with negative (−) electric charges. As a result, in a normal state, the surface of the wafer 200 between the patterns 210 may be charged with positive (+) electric charges of the ions Ji. Such a phenomenon is becoming a more serious concern because the patterns 210 are formed in a finer shape as the integration density of the semiconductor device increases. Therefore, in a case in which the wafer 200 is electrically insulated, portions at which the patterns 210 and the surface of the wafer 200 are contacted with each other are charged with positive (+) electric charges, whereas the sides of the patterns 210 are charged with negative (−) electric charges.

In addition, the plasma itself has spatial nonuniformity according to the environment of the equipment itself or plasma conditions. In such cases, charging density nonuniformity of the wafer may be even more seriously.

In most cases, the deposition and etch processes using plasma are performed on the surface of a nonconductive material, for example, an insulation material such as silicon oxide ($SiO_2$). As described above, as the charging density is uniformly formed, an electric current is generated from a low-charging-density side to a high-charging-density side so as to resolve the nonuniform charging density. Such an electric current flows through an element inside the wafer, for example, a gate dielectric layer. Thus, electric stress is applied to the semiconductor device, and PID such as an electron trap and a leakage current path is caused within the gate dielectric layer.

More specifically, a strong electric field may be formed in a thin metal interconnection by the nonuniform charging density, and thus, the metal interconnection may become molten.

In addition, the strong electric field increases a potential difference between a gate and a bulk, and the gate dielectric layer is broken accordingly.

Furthermore, the nonuniform charging density influences a threshold voltage of a transistor, and characteristics of the transistor are changed accordingly.

In the prior art aimed at preventing PID, the nonuniform charging density is accounted for by inserting a protection diode to form an artificial ion discharging path.

According to the prior art, in a case in which a well area is large, a protection diode is formed in an individual junction. In particular, since the well of the semiconductor device has a large area, it needs to be protected from PID using a separate protection device. Thus, a PID-prevention diode junction is formed in each junction.

However, the prior art is disadvantageous in that a layout area is greatly increased due to the insertion of the protection diode.

In addition, the prior art is disadvantageous in that an active region should be formed so as to form a hole for the insertion of the diode, and thus, an overall area is increased as much as the active region.

SUMMARY

Exemplary embodiments of the present invention are directed to a PID-prevention semiconductor device and a layout thereof.

In accordance with an exemplary embodiment of the present invention, a semiconductor device includes a diode having a first terminal connected to a first-conductivity-type well, and a second-conductivity-type MOS transistor having a first junction and a gate connected to a second terminal of the diode, and a second junction connected to a first power supply voltage terminal.

In accordance with another exemplary embodiment of the present invention, a semiconductor device layout includes a first-conductivity-type well formed over a substrate, a second-conductivity-type junction region formed in the first-conductivity-type well and constituting a diode with the first-conductivity-type well, a second-conductivity-type MOS transistor formed on the first-conductivity-type well, a first interconnection connecting the second-conductivity-type junction region to a first junction and a gate of the second-conductivity-type MOS transistor, and a second interconnection connecting a second junction of the second-conductivity-type MOS transistor to a first power supply voltage terminal.

In accordance with yet another exemplary embodiment of the present invention, a semiconductor device layout includes a first-conductivity-type well formed over a substrate, a second-conductivity-type MOS transistor formed on the first-conductivity-type well, a first interconnection connecting a first junction of the second-conductivity-type MOS transistor and a gate of the second-conductivity-type MOS transistor, and a second interconnection connecting a second junction of the second-conductivity-type MOS transistor to a first power supply voltage terminal. The first-conductivity-type well and the first junction of the first junction of the second-conductivity-type MOS transistor constitute a diode, and the diode is turned on by electric charges accumulated in the first-conductivity-type well.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

In accordance with exemplary embodiments of the present invention, a PID-prevention diode junction is not formed in each junction, as opposed to the prior art. Instead, a circuit is constructed in a well, and therefore, electric charges formed nonuniformly in the well by a process using plasma are directly discharged. In particular, electric charges formed nonuniformly in the well when a bias is applied in a test process and a package process can be naturally discharged.

Figure 3:
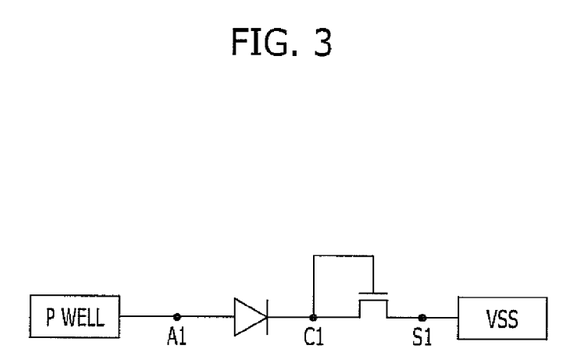
FIG. 3 is a circuit diagram of a PID-prevention semiconductor device in accordance with a first exemplary embodiment of the present invention.

FIG. 3 is a circuit diagram of a PID-prevention semiconductor device in accordance with a first exemplary embodiment of the present invention.

Referring to FIG. 3, the PID-prevention semiconductor device in accordance with the first exemplary embodiment of the present invention includes a P well doped with a P-type impurity, a diode, and an NMOS transistor having its gate and drain connected together. The P well is electrically connected to an anode A1 of the diode, and the drain of the NMOS transistor is electrically connected to a cathode C1 of the diode. A source S1 of the NMOS transistor may be connected to a ground voltage terminal VSS.

The PID-prevention semiconductor device in accordance with the first exemplary embodiment of the present invention operates as follows. The diode is turned on when the potential of the anode A1 of the diode is higher than the potential of the cathode C1 of the diode. Thus, the potential of the P well is transferred to the gate of the NMOS transistor, which is coupled to the cathode C1. When the potential of the gate of the NMOS transistor is higher than a threshold voltage of the NMOS transistor, the NMOS transistor is turned on to form a path which allows electrons to move through the channel of the NMOS transistor to the ground voltage terminal VSS which may be connected to the source S1 of the NMOS transistor. Therefore, the potential of the P well which is raised by the plasma is lowered by the path which is formed by the diode, the NMOS transistor, and the ground voltage terminal VSS. In this manner, PID caused by the raised potential of the P well can be prevented.

Figure 4:
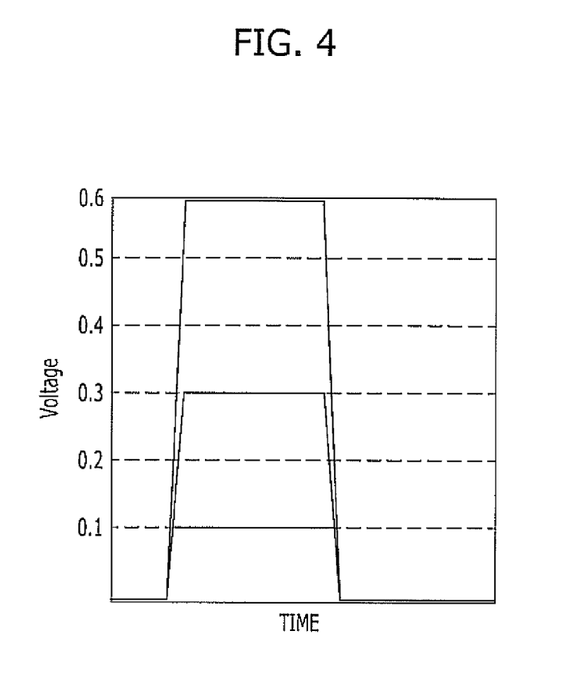
FIGS. 4 and 5 are simulation results of the PID-prevention semiconductor device in accordance with the first exemplary embodiment of the present invention.
Figure 5:
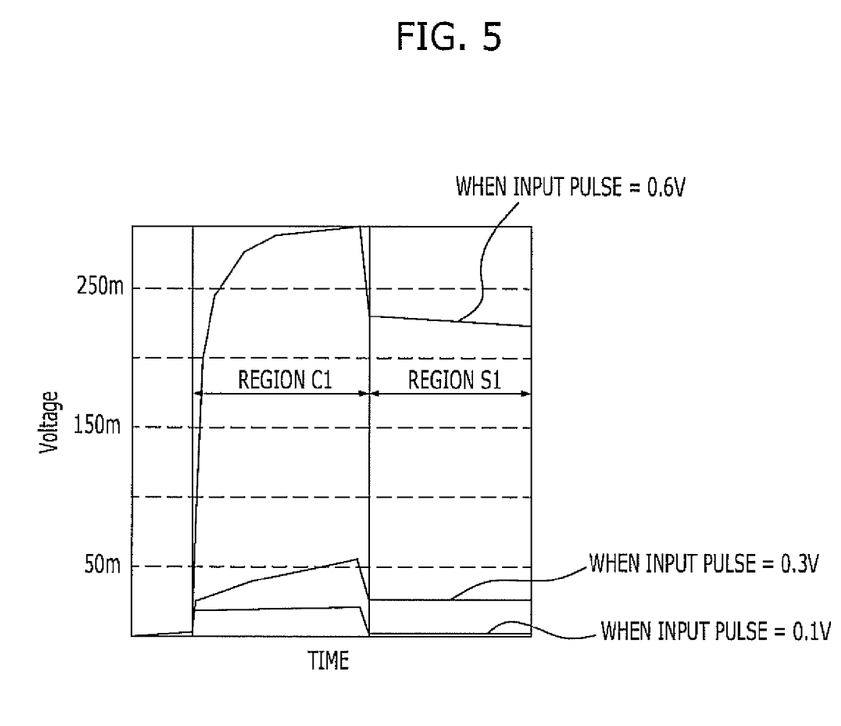

FIGS. 4 and 5 are simulation results of the PID-prevention semiconductor device in accordance with the first exemplary embodiment of the present invention. In the example illustrated in FIGS. 4 and 5, the threshold voltage of the NMOS transistor was 0.33 V.

As illustrated in FIG. 4, input pulses of 0.1 V, 0.3 V, and 0.6 V were applied to the anode A1 of the diode.

FIG. 5 is a graph showing the voltages measured at the cathode C1 of the diode and the source S1 of the NMOS transistor with respect to the input pulses.

As illustrated in FIG. 5, the potential of the cathode C1 of the diode became lower than the threshold voltage (0.33 V). Also, the potential of the source S1 of the NMOS transistor, after the input pulses, remained at a constant level when the voltage of the input pulse was lower than the threshold voltage (i.e., for input pulses of 0.1 V and 0.3 V). However, the potential of the source S1 of the NMOS transistor continuously dropped when the voltage of the input pulse was higher than the threshold voltage (i.e., for an input pulse of 0.6 V).

That is, in accordance with the exemplary embodiment of the present invention, PID can be prevented because electric charges are naturally discharged (the potential is lowered) when the potential of the P well is higher than the threshold voltage.

Figure 6:
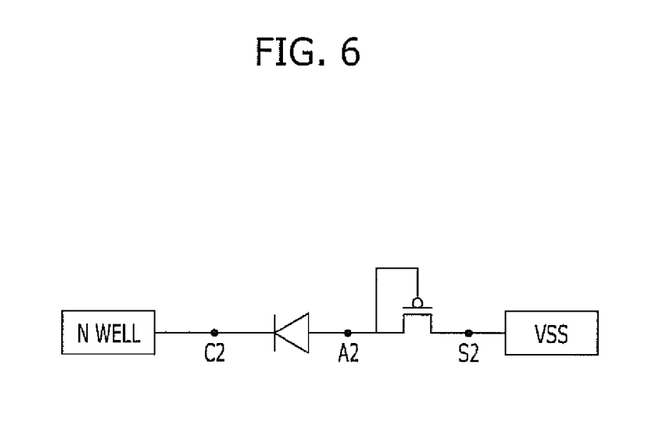
FIG. 6 is a circuit diagram of a PID-prevention semiconductor device in accordance with a second exemplary embodiment of the present invention.

FIG. 6 is a circuit diagram of a PID-prevention semiconductor device in accordance with a second exemplary embodiment of the present invention.

Referring to FIG. 6, the PID-prevention semiconductor device in accordance with the second exemplary embodiment of the present invention includes an N well doped with an N-type impurity, a diode, and a PMOS transistor having its gate and drain connected together. The N well is electrically connected to the cathode C2 of the diode, and the drain of the PMOS transistor is electrically connected to the anode A2 of the diode. A source S2 of the PMOS transistor may be connected to a ground voltage terminal VSS.

The PID-prevention semiconductor device in accordance with the second exemplary embodiment of the present invention operates as follows. The diode is turned on when the potential of the cathode C2 of the diode is lower than the potential of the anode A2 of the diode. Thus, the potential of the N well is transferred to the gate of the PMOS transistor, which is coupled to the anode A2. When the potential of the gate of the PMOS transistor is lower than a threshold voltage of the PMOS transistor, the PMOS transistor is turned on to form a path to the ground voltage terminal VSS connected to the source S2 of the NMOS transistor. Therefore, the potential of the N well which is lowered by the plasma (e.g., ion-doping of the plasma) is lowered by the path which is formed by the diode, the PMOS transistor, and the ground voltage terminal VSS. In this manner, PID caused by the lowered potential of the N well can be prevented.

Hereinafter, the layouts of the RID-prevention semiconductor devices in accordance with the first and second exemplary embodiments of the present invention will be described. As described above, a semiconductor device in accordance with the exemplary embodiments of the present invention includes a diode electrically connected to a well, and a transistor. In accordance with the exemplary embodiments of the present invention, a protection circuit may not be constructed for each junction formed on the well, and yet, electric charges formed nonuniformly by a process using plasma may be directly discharged. Therefore, because the RID-prevention semiconductor devices in accordance with the first and second exemplary embodiments of the present invention can prevent PID and may be implemented in a relatively small amount of space, they are advantageous for improving the integration of semiconductor devices.

Figure 7:
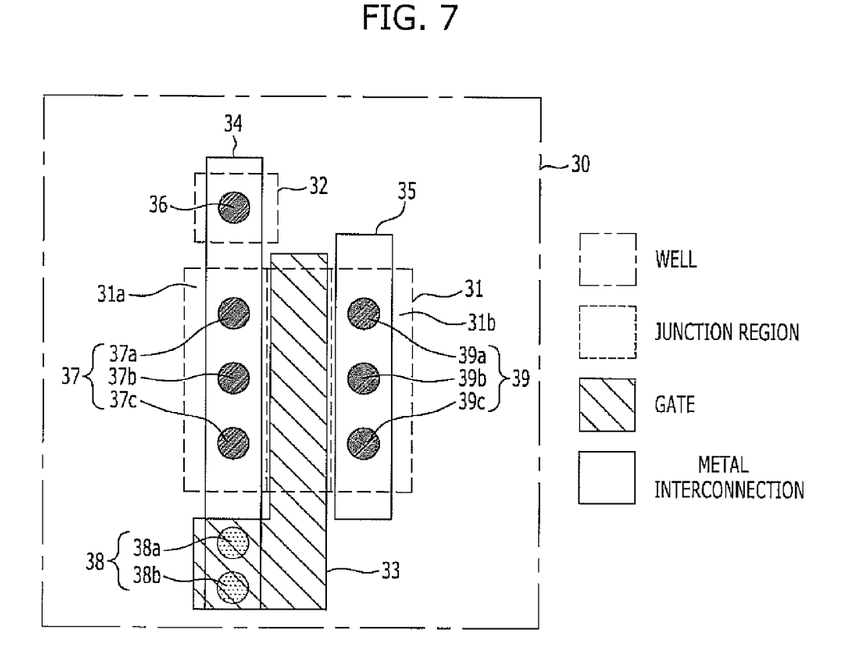
FIG. 7 is a layout view of the PID-prevention semiconductor device in accordance with the first exemplary embodiment of the present invention.

FIG. 7 is a layout view of the PID-prevention semiconductor device in accordance with the first exemplary embodiment of the present invention.

Referring to FIG. 7, an NMOS transistor junction region 31 and a diode junction 32 are disposed on a well 30 doped with a P-type impurity. The diode junction 32 may be disposed near the NMOS transistor junction region 31. Although not shown, an isolation layer may be formed between the NMOS transistor junction region 31 and the diode junction 32. For example, an insulation layer may be formed in a shallow trench isolation (STI) structure.

A P-N diode is formed from the diode junction 32 doped with an N-type impurity and the well 30 doped with a P-type impurity. For example, the P-N diode may be formed by doping an N-type impurity into the diode junction 32 formed over the P-type well 30. Thus, the well 30 becomes the anode A1, and the diode junction 32 becomes the cathode C1.

The NMOS transistor junction region 31 includes a drain 31a and a source 31b. The drain 31a and the source 31b are doped with an N-type impurity. Specifically, the drain 31a and the source 31b may be heavily doped with an N-type impurity.

FIG. 7 also shows a layout of a gate electrode 33 of the NMOS transistor. The gate electrode 33 may include polysilicon, and the gate electrode 33 may be formed over the NMOS transistor junction region 31 between the drain 31a and the source 31b. As shown in FIG. 7, in addition to crossing over the NMOS transistor junction region 31, the gate electrode 33 may also expand over the well 30 in the direction of the drain 31a.

A first metal interconnection 34 is disposed on the diode junction 32 and the NMOS transistor junction region 31. Further, a second metal interconnection 35 is disposed on another part of the NMOS transistor junction region 31. As shown in FIG. 7, the first and second metal interconnections 34 and 35 are approximately parallel to one another and are separated by a space. Here, the first and second metal interconnections 34 and 35 may be bit lines.

The first metal interconnection 34 is electrically connected to the diode junction 32, the drain 31a, and the gate electrode 33. Therefore, the first metal interconnection 34 may be disposed to overlap at least a portion of the diode junction 32, the drain 31a, and the gate electrode 33. As shown in FIG. 7, the diode junction 32, the drain 31a, and the gate electrode 33 may be arranged so that the first metal interconnection 34, having a linear shape, can extend over them.

The first metal interconnection 34 and the diode junction 32 may be electrically connected together through a first contact plug 36. That is, where one or more layers exist between the first metal interconnection 34 and the diode junction 32, the first metal interconnection 34 may be electrically connected to the diode junction 32 through the first contact plug 36. Although only one first contact plug 36 is shown in FIG. 7, more than one contact plug may be used to connect the first metal interconnection 34 to the diode junction 32.

In addition, the first metal interconnection 34 and the drain 31a may be electrically connected through one or more second contact plugs 37. In FIG. 7, three second contact plugs 37a, 37b and 37c are exemplarily illustrated.

Further, the first metal interconnection 34 and the gate electrode 33 may be electrically connected through one or more third contact plugs 38. In FIG. 7, two third contact plugs 38a and 38b are exemplarily illustrated.

The second metal interconnection 35 may be electrically connected to the source 31b. Therefore, the second metal interconnection 35 may be disposed to overlap the source 31b. As shown in FIG. 7, the second metal interconnection 35 may have a linear shape and may be parallel to the first metal interconnection 34.

The second metal interconnection 35 is connected to an external power supply terminal (for example, a ground voltage terminal VSS). The second metal interconnection 35 may be electrically connected to the source 31b through one or more fourth contact plugs 39. In FIG. 7, three fourth contact plugs 39a, 39b and 39c are exemplarily illustrated.

The first to fourth contact plugs may be formed by first forming holes in layers (e.g., insulation layers) on the diode junction 32 and the NMOS transistor junction region 31.

At this time, the holes of the first to fourth contact holes can be simultaneously formed. After the holes are formed, the holes may be filled with a conductive material to form the contact plugs. Then, the first and second metal interconnections 34 and 35 may be formed (e.g., deposited) over the contact plugs.

As described above, the PID-prevention semiconductor device of FIG. 3 may be configured to have a layout as illustrated in FIG. 7.

Figure 8:
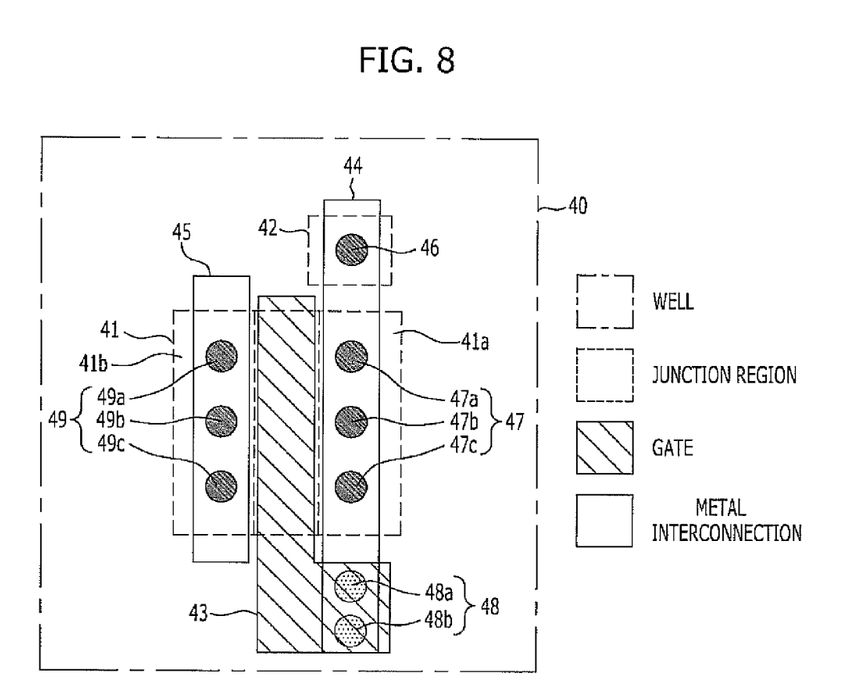
FIG. 8 is a layout view of the PID-prevention semiconductor device in accordance with the second exemplary embodiment of the present invention.

FIG. 8 is a layout view of the PID-prevention semiconductor device in accordance with the second exemplary embodiment of the present invention. The second exemplary embodiment utilizes an N-type well. The layout illustrated in FIG. 8 is similar to the layout illustrated in FIG. 7, and thus, for convenience, a description of overlapping features may be omitted.

Referring to FIG. 8, a PMOS transistor junction region 41 and a is diode junction 42 are disposed on a well 40 doped with an N-type impurity. The diode junction 42 may be disposed near the PMOS transistor junction region 41.

A diode is formed from the diode junction 42 doped with a P-type impurity and the well doped with an N-type impurity. For example, the diode may be formed by doping a P-type impurity into the diode junction 42 formed over the N-type well 40. Thus, the well 40 becomes the cathode C2, and the diode junction 42 becomes the anode A2.

The PMOS transistor junction region 41 includes a drain 41a and a source 41b. The drain 41a and the source 41b are doped with a P-type impurity. Specifically, the drain 41a and the source 41b may be heavily doped with a P-type impurity.

FIG. 8 also shows a layout of a gate 43 of the PMOS transistor. The gate 43 may include polysilicon, and the gate 43 may be formed over the PMOS transistor junction region 41 between the drain 41a and the source 41b. As shown in FIG. 8, in addition to crossing over the PMOS transistor junction region 41, the gate 43 may also expand over the well 40 in the direction of the drain 41a.

A third metal interconnection 44 is disposed on the diode junction 42 and the PMOS transistor junction region 41. Further, a fourth metal interconnection 45 is disposed on another part of the PMOS transistor junction region 41. As shown in FIG. 8, the third and fourth metal interconnections 44 and 45 are approximately parallel to one another and are separated by a space. Here, the third and fourth metal interconnections 44 and 45 may be bit lines.

The third metal interconnection 44 is electrically connected to the diode junction 42, the drain 41a, and the gate 43. Therefore, the third metal interconnection 44 may be disposed to overlap at least a portion of the diode junction 42, the drain 41a, and the gate 43. As shown in FIG. 8, the diode junction 42, the drain 41a, and the gate 43 may be arranged so that the third metal interconnection 44, having a linear shape, can extend over them.

The third metal interconnection 44 and the diode junction 42 may be electrically connected together through a fifth contact plug 46. That is, where one or more layers exist between the third metal interconnection 44 and the diode junction 42, the third metal interconnection 44 may be electrically connected to the diode junction 42 through the fifth contact plug 46. Although only one fifth contact plug 46 is shown in FIG. 8, more than one contact plug may be used to connect the third metal interconnection 44 to the diode junction 42.

In addition, the third metal interconnection 44 and the drain 41a may be electrically connected through one or more sixth contact plugs 47. In FIG. 8, three sixth contact plugs 47a, 47b and 47c are exemplarily illustrated.

Further, the third metal interconnection 44 and the gate 43 may be electrically connected through one or more seventh contact plugs 48. In FIG. 8, two seventh contact plugs 48a and 48b are exemplarily illustrated.

The fourth metal interconnection 45 may be electrically connected to the source 41b. Therefore, the fourth metal interconnection 45 may be disposed to overlap the source 41b. As shown in FIG. 8, the fourth metal interconnection 45 may have a linear shape and may be parallel to the third metal interconnection 44.

The fourth metal interconnection 45 may be electrically connected to the source 41b through one or more eighth contact plugs 49. In FIG. 8, three eighth contact plugs 49a, 49b and 49c are exemplarily illustrated.

The fifth to eighth contact plugs may be formed by first forming holes in layers (e.g., insulation layers) on the diode junction 42 and the PMOS transistor junction region 41.

At this time, the holes of the fifth to eighth contact holes can be simultaneously formed. After the holes are formed, the holes may be filled with a conductive material to form the contact plugs. Then, the third and fourth metal interconnections 44 and 45 may be formed (e.g., deposited) over the contact plugs.

As described above, the PID-prevention semiconductor device of FIG. 6 may be configured to have a layout as illustrated in FIG. 8.

Figure 9:
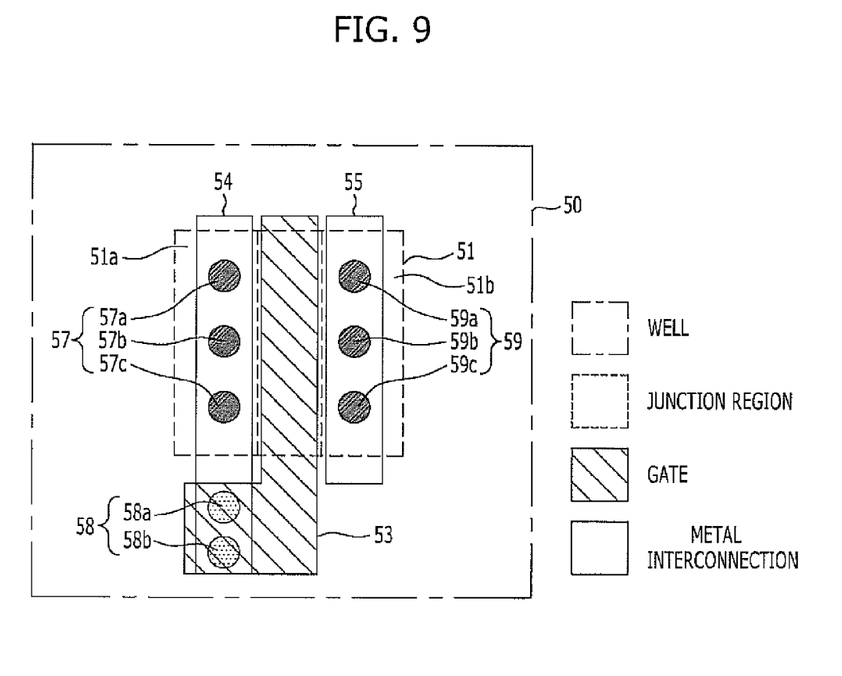
FIG. 9 is another layout view of the PID-prevention semiconductor device in accordance with the first exemplary embodiment of the present invention.

FIG. 9 is another layout view of the PID-prevention semiconductor device in accordance with the first exemplary embodiment of the present invention.

In the case of the layout illustrated in FIG. 9, a diode junction area can be reduced because the diode junction area is not separately formed. That is, the layout can be compactly designed because the junction between the N-type impurity of the drain of the NMOS transistor and the P well may also serve as a diode.

Referring to FIG. 9, an NMOS transistor junction region 51 is disposed on a well 50 doped with a P-type impurity.

The layout of FIG. 9 is designed so that the N-type impurity doped into a drain 51a, instead of a separate diode junction space, may serve as a cathode of a diode. That is, the junction between the drain 51a and the well 50 constitutes a diode. Therefore, the well 50 becomes the anode of the diode, and the drain 51a becomes the cathode of the diode.

The NMOS transistor junction region 51 includes the drain 51a and a source 51b. The drain 51a and the source 51b are doped with an N-type impurity. Specifically, the drain 51a and the source 51b may be heavily doped with an N-type impurity.

FIG. 9 also shows a layout of a gate 53 of the NMOS transistor. The gate 53 may include polysilicon, and the gate 53 may be formed over the NMOS transistor junction region 51 between the drain 51a and the source 51b. As shown in FIG. 9, in addition to crossing over the NMOS transistor junction region 51, the gate 53 may also expand over the well 50 in the direction of the drain 51a.

A fifth metal interconnection 54 is disposed on the NMOS transistor junction region 51. Further, a sixth metal interconnection 55 is disposed on another part of the NMOS transistor region 51. As shown in FIG. 9, the fifth and sixth metal interconnections 54 and 55 are approximately parallel to one another and are separated by a space. Here, the fifth and sixth metal interconnections 54 and 55 may be bit lines.

The fifth metal interconnection 54 is electrically connected to the drain 51a and the gate 53. Therefore, the fifth metal interconnection 54 may be disposed to overlap at least a portion of the drain 51a and the gate 53. As shown in FIG. 9, the drain 51a and the gate 53 may be arranged so that the fifth metal interconnection 54, having a linear shape, can extend over them.

The fifth metal interconnection 54 and the drain 51a may be electrically connected together through a ninth contact plug 57. That is, where one or more layers exist between the fifth metal interconnection 54 and the drain 51a, the fifth metal interconnection 54 may be electrically connected to the drain 51a through the ninth contact plug 57. Also, more than one contact plug may be used to connect the fifth metal interconnection 54 to the drain 51a. As shown in FIG. 9, three ninth contact plugs 57a, 57b, and 57c may be implemented.

Further, the fifth metal interconnection 54 and the gate 53 may be electrically connected together through one or more tenth contact plugs 58. In FIG. 9, two tenth contact plugs 58a and 58b are exemplarily illustrated in FIG. 9.

The sixth metal interconnection 55 may be electrically connected to the source 51b. Therefore, the sixth metal interconnection 55 may be disposed to overlap the source 51b. As shown in FIG. 9, the sixth metal interconnection 55 may have a linear shape and may be parallel to the fifth metal interconnection 54. The sixth metal interconnection 55 may also be connected to an external power supply terminal, for example, a ground voltage terminal VSS.

The sixth metal interconnection 55 may be electrically connected to the source 51b through one or more eleventh contact plugs 59. In FIG. 9, three eleventh contact plugs 59a, 59b and 59c are exemplarily illustrated.

The ninth to eleventh contact plugs may be formed by first forming holes in layers (e.g., insulation layers) on the NMOS transistor junction region 51.

At this time, the holes of the ninth to eleventh contact holes can be simultaneously formed. After the holes are formed, the holes may be filled with a conductive material to form the contact plugs. Then, the fifth and sixth metal interconnections 54 and 55 may be formed (e.g., deposited) over the contact plugs.

As described above, the PID-prevention semiconductor device of FIG. 3 may be configured to have a layout as illustrated in FIG. 9.

Figure 10:
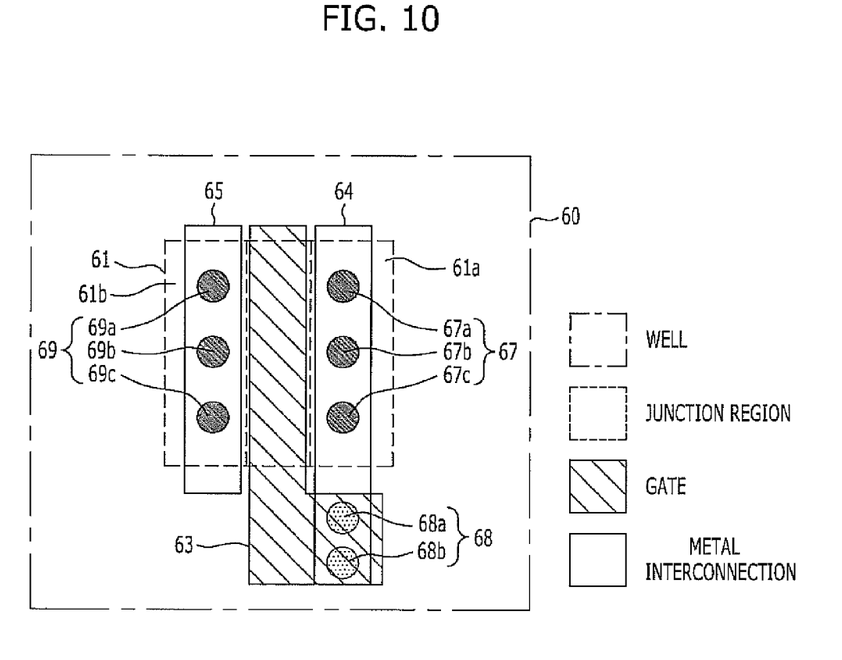
FIG. 10 is another layout view of the PID-prevention semiconductor device in accordance with the second exemplary embodiment of the present invention.

FIG. 10 is another layout view of the PID-prevention semiconductor device in accordance with the second exemplary embodiment of the present invention.

In the case of the layout illustrated in FIG. 10, a diode junction area can be reduced because the diode junction area is not separately formed. That is, the layout can be compactly designed because the junction between the P-type impurity of the drain of the PMOS transistor and the N well may also serve as a diode.

Referring to FIG. 10, a PMOS transistor junction region 61 is disposed on a well 60 doped with an N--type impurity.

The layout of FIG. 10 is designed so that the P-type impurity doped into a drain 61a, instead of a separate diode junction space, may serve as an anode of a diode. That is, the junction between the drain 61a and the well 60 constitutes a diode. Therefore, the well 60 becomes the cathode of the diode, and the drain 61a becomes the anode of the diode.

The PMOS transistor junction region 61 includes the drain 61a and a source 61b. The drain 61a and the source 61b are doped with a P-type impurity. Specifically, the drain 61a and the source 61b may be heavily doped with a P-type impurity.

FIG. 10 also shows a layout of a gate 63 of the PMOS transistor. The gate 63 may include polysilicon, and the gate 63 may be formed over the PMOS transistor junction region 61 between the drain 61a and the source 61b. As shown in FIG. 10, in addition to crossing over the PMOS transistor junction region 61, the gate 63 may also expand over the well 60 in the direction of the drain 61a.

A seventh metal interconnection 64 is disposed on the PMOS transistor junction region 61. Further, a seventh metal interconnection 64 is disposed on another part of the PMOS transistor region 61. As shown in FIG. 10, the seventh and eighth metal interconnections 64 and 65 are approximately parallel to one another and are separated by a space. Here, the seventh and eighth metal interconnections 64 and 65 may be bit lines.

The seventh metal interconnection 64 is electrically connected to the drain 61a and the gate 63. Therefore, the seventh metal interconnection 64 may be disposed to overlap at least a portion of the drain 61a and the gate 63. As shown in FIG. 10, the drain 61a and the gate 63 may be arranged so that the seventh metal interconnection 64, having a linear shape, can extend over them.

The seventh metal interconnection 64 and the drain 61a may be electrically connected together through a twelfth contact plug 67. That is, where one or more layers exist between the seventh metal interconnection 64 and the drain 61a, the seventh metal interconnection 64 may be electrically connected to the drain 61a through the twelfth contact plug 67. Also, more than one contact plug may be used to connect the seventh metal interconnection 64 to the drain 61a. As shown in FIG. 10, three twelfth contact plugs 67a, 67b and 67c are exemplarily illustrated.

Further, the seventh metal interconnection 64 and the gate 63 may be electrically connected together through one or more thirteenth contact plugs 68. In FIG. 10, two thirteenth contact plugs 68a and 68b are exemplarily illustrated.

The eighth metal interconnection 65 may be electrically connected to the source 61b. Therefore, the eighth metal interconnection 65 may be disposed to overlap the source 61b. As shown in FIG. 10, the eighth metal interconnection 65 may have a linear shape and may be parallel to the seventh metal interconnection 64.

The eighth metal interconnection 65 may be electrically connected to the source 61b through one or more fourteenth contact plugs 69. In FIG. 10, three fourteenth contact plugs 69a, 69b and 69c are exemplarily illustrated.

The twelfth to fourteenth contact plugs may be achieved by first forming holes in layers (e.g., insulation layers) on the PMOS transistor junction region 61.

At this time, the holes of the twelfth to fourteenth contact holes can be simultaneously formed. After the holes are formed, the holes may be filled with a conductive material to form the contact plugs. Then, the seventh and eighth metal interconnections 64 and 65 may be formed (e.g., deposited) over the contact plugs.

As described above, the PID-prevention semiconductor device of FIG. 6 may be configured to have a layout as illustrated in FIG. 10.

Figure 11:
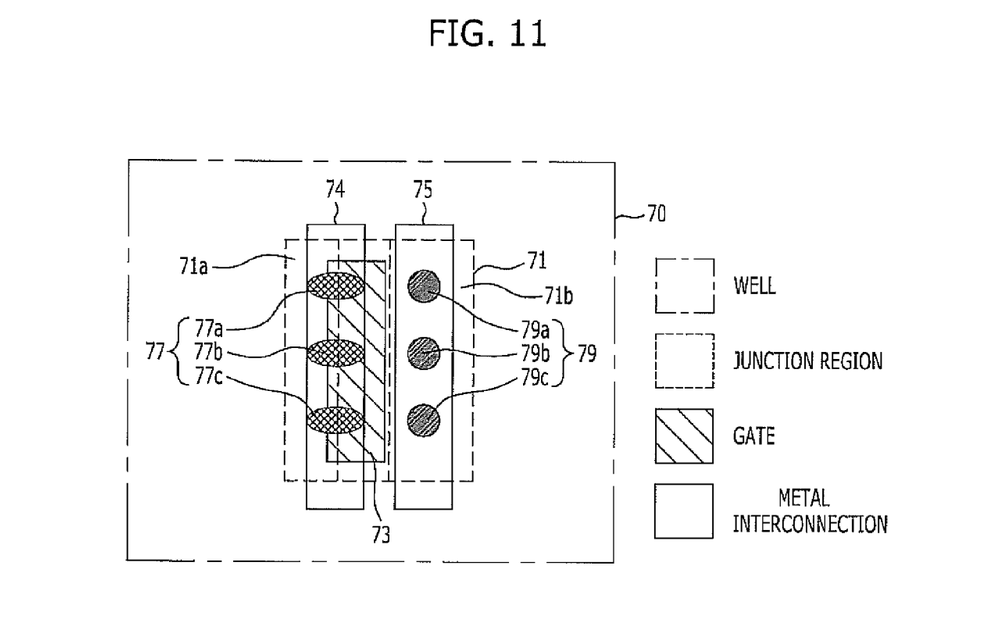
FIG. 11 is yet another layout view of the PID-prevention semiconductor device in accordance with the first exemplary embodiment of the present invention.

FIG. 11 is a yet another layout view of the PID-prevention semiconductor device in accordance with the first exemplary embodiment of the present invention.

In the case of the layout illustrated in FIG. 11, the layout can be compactly designed because a drain, a gate, and a metal interconnection are connected vertically through a single contact plug. In particular, the area can be reduced by forming a contact plug of the gate and the metal interconnection on an NMOS transistor junction.

Referring to FIG. 11, an NMOS transistor junction region 71 is disposed on a well 70 doped with a P-type impurity.

The layout of FIG. 11 is designed so that the N-type impurity doped into a drain 71a, instead of a separate diode junction space, may serve as a cathode of a diode. That is, the junction between the drain 71a and the well 70 constitutes a diode. Therefore, the well 70 becomes the anode of the diode, and the drain 71a becomes the cathode of the diode.

The NMOS transistor junction region 71 includes the drain 71a and a source 71b. The drain 71a and the source 71b are doped with an N-type impurity. Specifically, the drain 71a and the source 71b may be heavily doped with an N-type impurity.

FIG. 11 shows a layout of a gate 73 of the NMOS transistor. The gate 73 may include polysilicon, and the gate 73 may be formed over the NMOS transistor junction region 71 between the drain 71a and the source 71b. Because the gate 73 shares a contact plug with the drain 71a, the gate 73 does not have to extend toward the drain 71a.

A ninth metal interconnection 74 is disposed on the NMOS transistor junction region 71. Further, a tenth metal interconnection 75 is disposed on another part of the NMOS transistor region 71. As shown in FIG. 11, the ninth and tenth metal interconnections 74 and 75 are approximately parallel to one another and are separated by a space. Here, the ninth and tenth metal interconnections 74 and 75 may be bit lines.

The ninth metal interconnection 74 is disposed to overlap the drain 71a and the gate 73. Therefore, the drain 71a and the gate 73 may be electrically connected together using a contact plug that connects the ninth metal interconnection 74, the gate 73, and the drain 71a.

That is, a fifteenth contact plug 77 passes through the gate 73, and electrically connects the drain 71a and the ninth metal interconnection 74. In addition, the gate electrode 73 and the ninth metal interconnection 74 are electrically connected together through the fifteenth contact plug 77. Also, more than one contact plug may be used to electrically connect the ninth metal interconnection 74, the gate 73, and the drain 71a. As shown in FIG. 11, three fifteenth contact plugs 77a, 77b, and 77c may be implemented.

The tenth metal interconnection 75 and the source 71b may be electrically connected together. Therefore, the tenth metal interconnection 75 may be disposed to overlap the source 71b. As shown in FIG. 11, the tenth metal interconnection 75 may have a linear shape and may be parallel to the ninth metal interconnection 74.

The tenth metal interconnection 75 and the source 71b may be electrically connected together through one or more sixteenth contact plugs 79. In FIG. 11, three sixteenth contact plugs 79a, 79b, and 79c are exemplarily illustrated.

As described above, the AID-prevention semiconductor device of FIG. 3 may be configured to have a layout as illustrated in FIG. 11.

Figure 12:
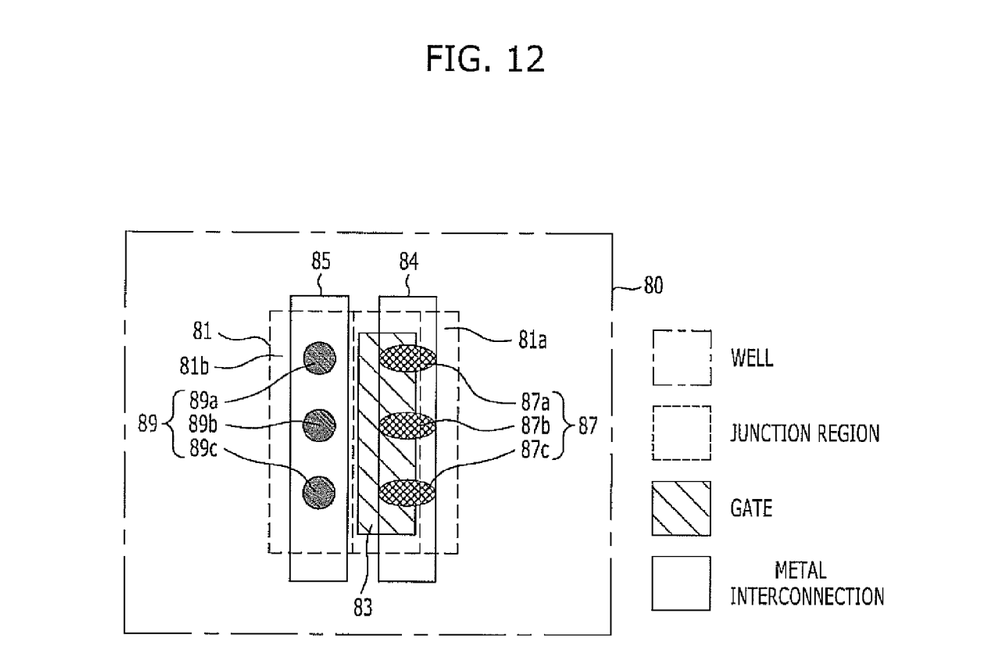
FIG. 12 is yet another layout view of the PID-prevention semiconductor device in accordance with the second exemplary embodiment of the present invention.

FIG. 12 is a yet another layout view of the PID-prevention semiconductor device in accordance with the second exemplary embodiment of the present invention.

In the case of the layout illustrated in FIG. 12, the layout can be compactly designed because a drain, a gate, and a metal interconnection are connected vertically through a single contact plug. In particular, the area can be reduced by forming a contact plug of the gate and the metal interconnection on a PMOS transistor junction.

Referring to FIG. 12, a PMOS transistor junction region 81 is disposed on a well 80 doped with an N-type impurity.

The layout of FIG. 12 is designed so that the P-type impurity doped into a drain 81a, instead of a separate diode junction space, may serve as an anode of a diode. That is, the junction between the drain 81a and the well 80 constitutes a diode. Therefore, the well 80 becomes the cathode of the diode, and the drain 81a becomes the anode of the diode.

An eleventh metal interconnection 84 and a twelfth metal interconnection 85 are disposed on the PMOS transistor junction region 81. Here, the eleventh and twelfth metal interconnections 84 and 85 may include bit lines.

The eleventh metal interconnection 84 is disposed to overlap the drain 81a and a gate electrode 83. Therefore, the drain 81a and the gate 83 may be electrically connected together using a contact plug that connects the eleventh metal interconnection 84, the gate 83, and the drain 81a.

That is, a seventeenth contact plug 87 passes through the gate 83, and electrically connects the drain 81a and the eleventh metal interconnection 84. In addition, the gate 83 and the eleventh metal interconnection 84 are electrically connected together through the seventeenth contact plug 87. Also, more than one contact plug may be used to electrically connect the eleventh metal interconnection 84, the gate 83, and the drain 81a. As shown in FIG. 12, three seventeenth contact plugs 87a, 87b, and 87c may be implemented.

The twelfth metal interconnection 85 and the source 81b may be electrically connected together. Therefore, the twelfth metal interconnection 85 may be disposed to overlap the source 81b. As shown in FIG. 12, the twelfth metal interconnection 85 may have a linear shape and may be parallel to the eleventh metal interconnection 84.

The twelfth metal interconnection 85 and the source 81b may be electrically connected together through one or more eighteenth contact plugs 89. In FIG. 12, three eighteenth contact plugs 89a, 89b, and 89c are exemplarily illustrated. As described above, the PID-prevention semiconductor device of FIG. 6 may be configured to have a layout as illustrated in FIG. 12.

Figure 13:
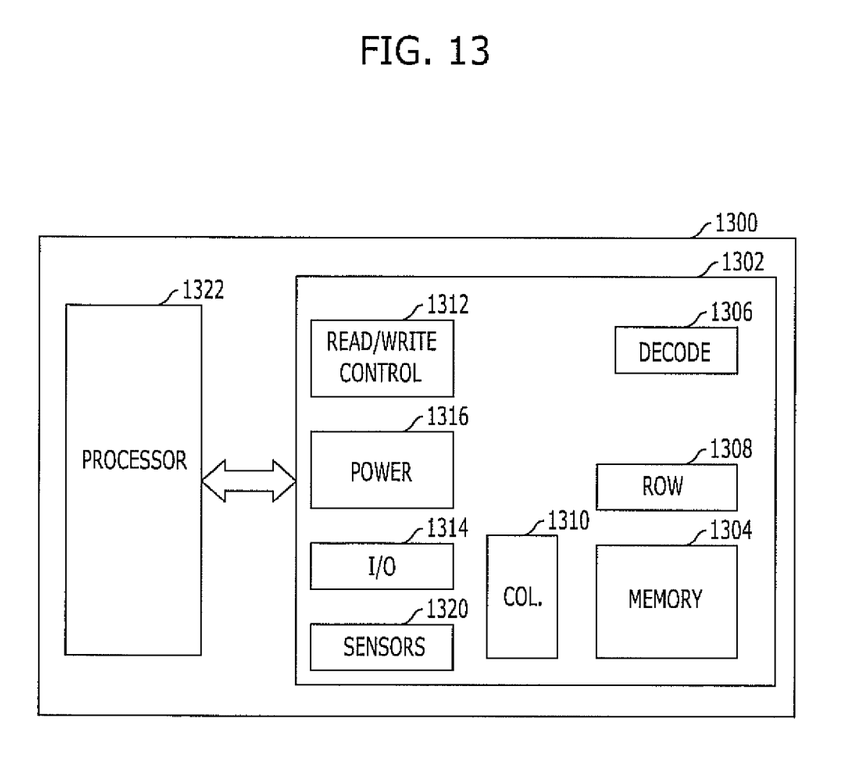
FIG. 13 is a simplified block diagram of an exemplary electronic system including a semiconductor device of a present application.

FIG. 13 is a simplified block diagram of an exemplary electronic system including a semiconductor device of a present application.

Referring to FIG. 13, an electronic system 1300 includes a memory device 1302 having an array of memory cells 1304, address decoder 1306, row access circuitry 1308, column access circuitry 1310, read/write control circuitry 1312 for controlling operations, and input/output circuitry 1314. The electronic system 1300 further includes a processor 1322, or memory controller for memory accessing.

The memory device 1302 further includes power circuitry 1316 and sensors 1320 (e.g., current sensors). The memory device 1302 receives control signals from the processor 1322 over wiring or metallization lines. The memory device 1302 is configured to store data which is accessed via I/O lines. At least one of the processor 1322 or memory device 1302 may include a memory construction using the present invention as described above.

As described above in the exemplary embodiments of the present invention, PID can be prevented by discharging electric charges formed non-uniformly in a well as a result of a process using plasma. Also herein, PID can be prevented with a configuration using a small area by directly discharging electric charges of the well, instead of with a configuration in which a protection circuit is used for each junction. Thus, exemplary embodiments of the present invention advantageous for improving the integration of the PID-prevention semiconductor device.

While the present invention has been described with respect to the specific embodiments, it will be apparent to those skilled in the art that various changes and modifications may be made without departing from the spirit and scope of the invention as defined in the following claims.

What is claimed is:
1. A semiconductor device comprising:
    a diode having a first terminal connected to a first-conductivity-type well; and a second-conductivity-type MOS transistor having a first junction and a gate connected to a second terminal of the diode, and a second junction connected to a first power supply voltage terminal.

2. The semiconductor device of claim 1, wherein the first-conductivity-type is a P type, the first terminal is an anode, and the first junction is a drain.

3. The semiconductor device of claim 1, wherein,
the first-conductivity-type is an N type,
the first terminal is a cathode, and
the first junction is a drain.

4. The semiconductor device of claim 1, wherein the first power supply voltage terminal is a ground voltage terminal.

5. A semiconductor device comprising:
a first-conductivity-type well formed over a substrate;
a second-conductivity-type junction region formed in the first-conductivity-type well and constituting a diode with the first-conductivity-type well;
a second-conductivity-type MOS transistor formed on the first-conductivity-type well;
a first interconnection connecting the second-conductivity-type junction region to a first junction and a gate of the second-conductivity-type MOS transistor; and
a second interconnection connecting a second junction of the second-conductivity-type MOS transistor to a first power supply voltage terminal.

6. The semiconductor device of claim 5, wherein the first interconnection is disposed to partially overlap the second-conductivity-type junction region, the first junction, and the gate.

7. The semiconductor device of claim 5, wherein,
the second-conductivity-type junction region and the first interconnection are electrically connected together by a first contact plug,
the first junction and the first interconnection are electrically connected together by a second contact plug, and
the gate and the first interconnection are electrically connected together by a third contact plug.

8. The semiconductor device of claim 7, wherein the first interconnection has a linear shape that extends over the second-conductivity-type junction region, the first junction, and the gate.

9. The semiconductor device of claim 8, wherein the second interconnection is electrically connected to the second junction of the second-conductivity-type MOS transistor by a fourth contact plug.

10. The semiconductor device of claim 9, wherein the first interconnection and the second interconnection are parallel to each other.

11. The semiconductor device of claim 5, wherein the first-conductivity-type is a P type, and the first junction is a drain.

12. The semiconductor device of claim 5, wherein the first-conductivity-type is an N type, and the first junction is a drain.

* * * * *